(12) United States Patent
Huang et al.

(10) Patent No.: US 6,939,789 B2
(45) Date of Patent: Sep. 6, 2005

(54) METHOD OF WAFER LEVEL CHIP SCALE PACKAGING

(75) Inventors: Chender Huang, Hsin-chu (CN); Pei-Haw Tsao, Taichung (CN); Jones Wang, Jung he (CN); Ken Chen, Hsinchu (CN)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 109 days.

(21) Appl. No.: 10/144,074

(22) Filed: May 13, 2002

(65) Prior Publication Data

US 2003/0211720 A1 Nov. 13, 2003

(51) Int. Cl.[7] .............................................. H01L 21/44
(52) U.S. Cl. ....................................... 438/612; 438/613
(58) Field of Search ................................ 438/612–614, 438/617

(56) References Cited

U.S. PATENT DOCUMENTS

| | | | | |
|---|---|---|---|---|
| 5,219,787 A | * | 6/1993 | Carey et al. ................. | 438/637 |
| 6,103,552 A | * | 8/2000 | Lin .............................. | 438/113 |
| 6,181,569 B1 | * | 1/2001 | Chakravorty ................ | 361/761 |
| 6,566,239 B2 | * | 5/2003 | Makino et al. .............. | 438/612 |
| 6,583,040 B1 | * | 6/2003 | Lin .............................. | 438/612 |
| 2002/0121692 A1 | * | 9/2002 | Lee et al. .................... | 257/737 |

* cited by examiner

*Primary Examiner*—Hoai Pham
*Assistant Examiner*—Ginette Peralta
(74) *Attorney, Agent, or Firm*—Tung & Associates (57) ABSTRACT

The invention includes a method of wafer level chip scale packaging including providing a semiconductor device having a silicon based substrate with discrete devices defined therein and a contact pad near an upper surface thereof, a passivation layer overlying the silicon based substrate and the contact pad, and the passivation layer having an opening therein exposing at least a portion of the contact pad, and a redistribution trace electrically connected to the contact pad near a first end and having a second end of spaced a distance from the contact pad. Forming an encapsulation layer over the semiconductor device including the redistribution trace. Forming an opening in the encapsulation layer down to the redistribution trace. Forming a contact post in the opening in the encapsulation layer, and the contact post having a first end electrically connected to the redistribution trace and a second exposed end. Forming an electrically conductive bump on the semiconductor device and in electrical contact with the contact post.

28 Claims, 4 Drawing Sheets

METHOD OF WAFER LEVEL CHIP SCALE PACKAGING

FIELD OF THE INVENTION

This invention relates to a method of making a bump on a substrate, and more particularly, to a method of making a wafer level chip scale package that includes a metal layer to redistribute very fine-pitched peripheral arrayed pads on a chip to a much larger pitch area arrayed pads with a metal post therein.

BACKGROUND OF THE INVENTION

From a manufacturing point of view, a wafer level chip scale package (WLCSP) is just an improved version of a traditional solder-bumped flip chip, except that the solder bumps on a WLCSP are much larger, the printed circuit board assembly of a WLCSP is more robust, and the manufacture usually does not have to struggle with an underfill encapsulant. WLCSP and flip chip manufacture share common components and techniques, particularly solder bumping. A brief discussion of flip chip technology will be helpful in understanding the present invention which primarily relates to WLCSPs.

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with a wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach" because the chip is directly attached to the substrate, board, or carrier by the conductive bumps.

The use a flip chip packaging has dramatically grown as a result of the flip chip's advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in a high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

A variety of UBM structures are known to those skilled in the art that accomplish the above functions and have one, two, three or more layers depending on whether the bump is gold, copper, aluminum, solder or nickel based. For gold based bumps, known UBM structure include layers of Cr—Cu, Ti—Pd, Ti—W, or Ti—Pt. For copper based bumps, known UBM structures include layers of Cr—Cu, or Al—Ni. For aluminum based bumps, known UBM structure include layers of Ti or Cr. For solder based bumps, known UBM structures include layers of Cr—Cu—Au, Ni—Cu, Ti—Cu, TiW—Cu, Ni—Au, or Al—NiV—Cu. For nickel based bumps, known UBM structure include layers of nickel. The UBM layers may be deposited by electroplating, evaporation, printing, electroless plating, and/or sputtering. It is also known to deposit one or more seed layers over the UBM structure prior to depositing the electrically conductive material (such as solder) that forms the bump.

In fabricating a flip-chip bond structure, the fabrication process requires a tight control of interface processes and manufacturing parameters in order to meet very small dimensional tolerances. Various techniques may be utilized to fabricate a UBM structure and to deposit the solder bump. A few widely used methods of depositing bumps include evaporation, electroplating, electroless plating and screen-printing. Kung et al, U.S. Pat. No. 6,179,200 provides a description of these more widely used methods of depositing bumps as follows.

The formation of solder bumps can be carried out by an evaporation method of Pb and Sn through a mask for producing the desired solder bumps. When a metal mask is used, UBM metals and solder materials can be evaporated through designated openings in the metal mask and be deposited as an array of pads onto the chip surface.

In one prior art evaporation method, a wafer is first passivated with an insulating layer such as $SiO_2$, via holes are then etched through the wafer passivation layer to provide a communication path between the chip and the outside circuit. After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final UBM layer of pure copper which forms the solderable metallurgy. A thin layer of gold may optionally be evaporated to provide an oxidation protection layer. These metal-layered pads define the solder wettable regions on the chips, which are commonly referred to as the ball limiting metallurgy (BLM) or under bump metallurgy (UBM). After the completion of UBM, solder evaporation occurs through a metal mask, which has a hole diameter slightly greater than the UBM mask-hole diameter. This provides the necessary volume for forming a subsequent solder ball. A solder reflow process is performed at a temperature of about 350° C. to melt and homogenize the evaporated metal pad and to impart a truncated spherical shape to the solder bump. The evaporation method, even though well established and has been practiced for a long time in the industry, is a slow process and thus can not be run at a high throughput rate.

A second method for forming solder bumps is the electroplating method. In an electroplating process, UBM layers are first deposited, followed by the deposition of a photoresist layer, the patterning of the photoresist layer, and then the electro-deposition of a solder material into the photoresist openings. After the electro-deposition process is completed, the photoresist layer can be removed and the UBM layers can be etched by using the plated solder bumps as a mask. The solder bumps are then reflowed in a furnace reflow process. The photolithography/electroplating technique is a simpler technique than evaporation and is less expensive because only a single masking operation is required. However, electroplating requires the deposition of a thick and uniform solder over the entire wafer area and etching metal layers on the wafer without damaging the plated solder layer. The technique of electroless plating may also be used to form the UBM structure.

Another solder bump formation technique that is capable of solder-bumping a variety of substrates is a solder paste screening method. The screen printing technique can be used to cover the entire area of an 8-inch wafer. In this method, a wafer surface covered by a passivation layer with bond pads exposed is first provided. UBM layers are then deposited on top of the bond pads and the passivation layer. A photoresist layer is deposited over the UBM. The portions of the UBM are etched followed by stripping off the photoresist layer. A stencil is then aligned on the wafer and solder paste is squeegeed through the stencil to fill the openings on top of the bond pads and the UBM layers. After the stencil is removed, the solder bumps may be reflowed in a furnace to form solder balls.

One drawback of the solder paste screen printing process is that, with the recent trend in the miniaturization of device dimensions and the reduction in bump to bump spacing (or pitch), the prior art solder paste screening techniques become impractical. For instance, one of the problems in applying solder paste screening technique to modern IC devices is the paste composition itself. A paste in generally composed of a flux and solder alloy particles. The consistency and uniformity of the solder paste composition becomes more difficult to control with a decreasing solder bump volume. A possible solution for this problem is the utilization of solder paste that contains extremely small and uniform solder particles. However, this can only be achieved at a very high cost penalty. Another problem is using the solder paste screening technique in modern high-density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

Several other methods are known to those skilled in the art for producing solder bumps on a semiconductor device. One such method is called the solder jet printing method. The solder jet printer method is based upon piezoelectric demand mode ink jet printing technology and is capable of producing and placing molten solder droplets 25–125 micrometers in diameter at rates of up to 2000 per second. In demand mode ink jet printing systems, a volumetric change in the fluid is induced either by the displacement of piezoelectric material that is coupled to the fluid or by the formation of the vapor bubble in the ink caused by heating a resistive element. The volumetric change causes pressure transience to occur in the fluid, and these are directed so as to produce a drop that issues from an orifice. A droplet is created only when it is desired in demand mode systems. Demand mode ink jet printing produces droplets that are approximately equal to the orifice diameter of the droplet generator.

Another method for producing solder bumps is known as the micro-punching method. In the micro-punching method, solder tape is supplied from a spool and rolled up by a motor driven spool. A micro-punch is driven by an electric actuator and a displacement enlarging mechanism. A micro-punch and die set blanks a thin solder tape and forms a small cylindrical piece. A solder flux may be formed over the entire semiconductor wafer to be bumped and the solder pieces may be punched and placed directly onto the wafer.

One of the most cost-effective packaging techniques is known as direct chip attach wherein a solder bumped flip chip is directly attached to a printed circuit board. However, due to the thermal expansion mismatch between the silicon chip and the printed circuit board (made from an epoxy or fiberglass material), an underfill encapsulant is usually needed for solder joint reliability. Due to the underfill operation, the manufacturing costs is increased in the manufacturing throughput is often substantially reduced. Further, reworking an underfill flip chip on a printed circuit board is practically impossible.

Another drawback of direct chip attach type microelectronic packaging techniques has to do with the pitch and size of the pads on the peripheral-arrayed chip. For direct chip attached assemblies, the bond pads are very small and result in high demand on the underlying printed circuit board.

Wafer level chip scale packages provide advantages over direct chip attached assemblies. In a wafer level chip scale package, a metal layer is used to redistribute the very fine pitched peripheral arrayed pads on the chip to much larger pitch area arrayed pads located in the interior portion of the upper face of the chip where larger solder joints may be provided for connection to the printed circuit board. Thus, the demands on the printed circuit board are much more relaxed using the wafer level chip sale packages.

Figure 1:
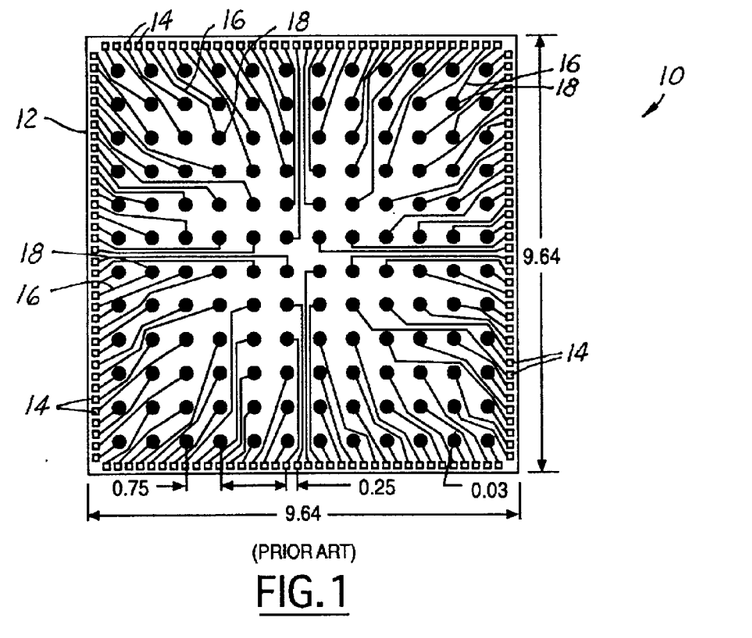
FIG. 1 is a plan view of the prior art wafer level chip scale package.

FIG. 1 illustrates a wafer level chip scale package 10 including a square chip 12, which may be for example, approximately 9.64 by 9.64 mm. The integrated circuit chip 12 includes a silicon base with discrete devices formed therein and metal interconnects overlying the discrete devices in a manner known to those skilled in the art. A plurality of peripheral-arrayed bond pads 14 are provided over the metal interconnects. For example, the bond pads 14 typically may have a size of about 0.1 mm. by 0.1 mm and may be positioned with respect to each other at a pitch of about 0.25 mm. A metal layer or electrically conductive redistribution traces 16 are deposited on top of the wafer to redistribute the fine-pitched peripheral-arrayed bond pads 14 to a much larger pitch area-arrayed pads in the interior of the chip onto which larger solder bump connections 18 are provided. For example, the solder bump connections 18 may be formed on a redistribution pads having a pitch of about 0.75 and a pad size of about 0.3 mm in diameter.

Figure 2A:
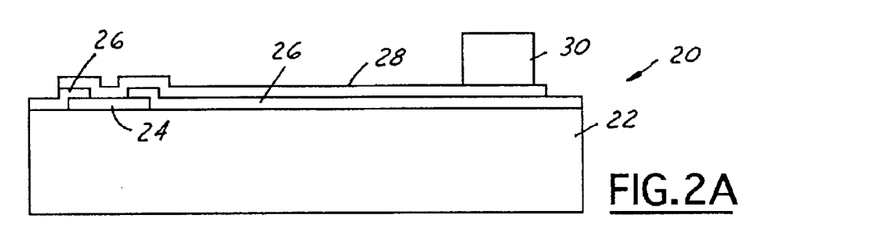
FIG. 2A illustrates a semiconductor device which includes a contact pad, a redistribution trace extending from the contact pad and a metal post connected to the redistribution trace.

FIG. 2A illustrates the step in a method of making a wafer level chip scale package according to the prior art. The semiconductor device 20 is provided having a silicon based substrate with discrete devices defined therein and a bond pad 24 associated with at least one of the discrete devices. A passivation layer 26 such as silicon dioxide is formed over the top surface of the silicon based substrate 22 and over a portion of the bond pad 24 leaving a portion thereof exposed. A redistribution trace 28 such as a copper layer is provided having one end connected to the bond pad 24 and another and extending generally horizontally away from the bond pad. A metal post 30, which is preferably made of copper, is provided at the other end of the redistribution trace 28. The metal post 30 is formed on the redistribution trace 28 by a number of complicated and costly steps.

Figure 2B:
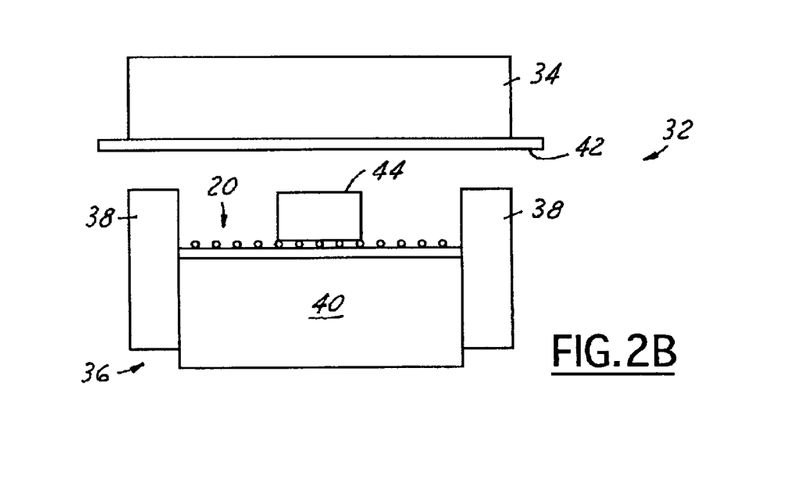
FIG. 2B illustrates a lamination machine and a prior art method of placing an encapsulation material onto the semiconductor device of FIG. 2A.

As illustrated in FIG. 2B, the semiconductor device 20 described in FIG. 2A is placed in a lamination machine 32 which includes an upper die half 34 and lowered die half 36. The lowered die half may include an outer die portion 38 and inner die portion 40. The semiconductor device 20 is preferably placed on the inner die portion 40. An encapsulation material 44 is placed over the top of the semiconductor device 20. The encapsulation material 44 may be an epoxy based material with a filler such as silica. A protective film 42 is also placed on the upper die half 34 to protect the upper surface of the metal post 30 and so that a subsequent clean step is not required to clean the upper surface of the metal post for the attachment of a solder ball. The protective film 42 also assists in releasing the semiconductor device from the upper die half 34.

Figure 2C:
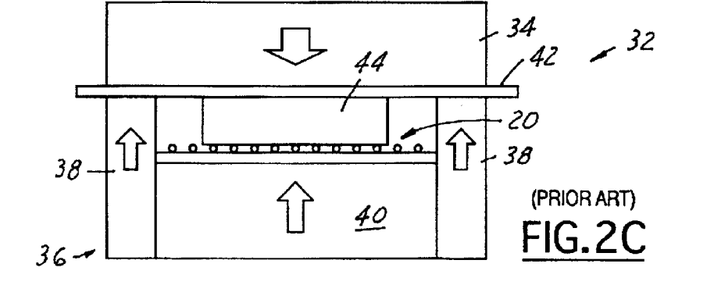
FIG. 2C illustrates the step of a prior art method wherein the encapsulation material is compressed by the two die halves of the lamination machine.
Figure 2D:
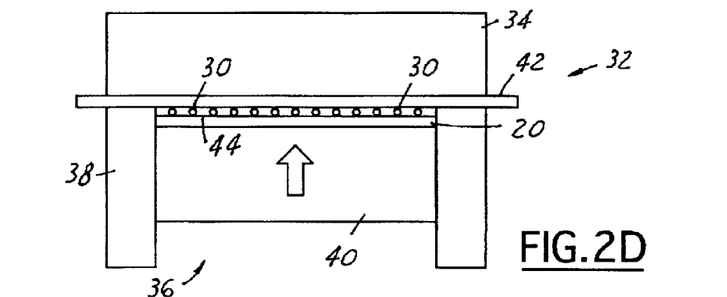
FIG. 2D illustrates the step of the prior art method in which the die halves of a lamination machine continued to compress the encapsulation material and heat the same so that the encapsulation material flows around the metal post of the semiconductor device.

As illustrated in FIG. 2C, the upper die half 34 and lower die half 36, and preferably the inner die portion 40, are moved toward each other so that the encapsulation material 44 is compressed between the semiconductor device and the film to 42 on the upper die half 34. The die halves 34 and 30 (and preferably 40) continue to be moved toward each other and heat is applied by the lamination machine so that the encapsulation material 44 flows around all of the metal post 30 (FIG. 2D).

Figure 2E:
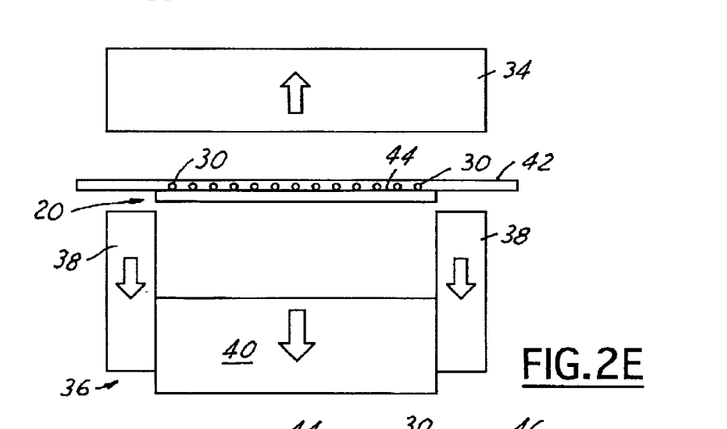
FIG. 2E illustrates the step of releasing the semiconductor device, with the encapsulation material surrounding the metal post, from the two halves of the lamination machine.
Figure 2F:
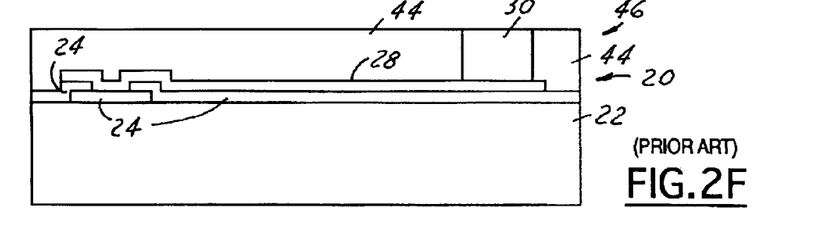
FIG. 2F illustrates the end product after the protective film has been removed from the semiconductor device to leave the encapsulation material surrounding the metal post.

As illustrated in FIG. 2E, once the encapsulation material 44 completely surrounds the metal post 30, the die halves 34, 36 (40) are moved away from each other to release the semiconductor device 20 (with the film 42 thereon) from the lamination machine. Thereafter, the protective film 42 is peeled off of the semiconductor device 20 to leave a finished product as illustrated in FIG. 2F which includes an encapsulation layer 42 surrounding the metal post 30 that is attached to the redistribution trace 28 of the semiconductor device 20. This prior art method requires special molding equipment and a special protective film both of which add to the cost of manufacturing the WLCSP. Furthermore, air bubbles can be easily trapped in the encapsulation material on the wafer surface to form voids during the molding process thus adversely impacting packaging yield. Thus, it would be desirable to provide a more cost effective and simple method of making a WLCSP with metal posts.

SUMMARY OF THE INVENTION

The invention includes a method of wafer level chip scale packaging including providing a semiconductor device having a silicon based substrate with discrete devices defined therein and a contact pad near an upper surface thereof, a passivation layer overlying the silicon based substrate and the contact pad, and the passivation layer having an opening therein exposing at least a portion of the contact pad, and a redistribution trace electrically connected to the contact pad near a first end and having a second end spaced a distance from the contact pad. Forming an encapsulation layer over the semiconductor device including the redistribution trace. Forming an opening in the encapsulation layer down to the redistribution trace. Forming a contact post in the opening in the encapsulation layer, and the contact post having a first end electrically connected to the redistribution trace and a second exposed end. Forming an electrically conductive bump on the semiconductor device and in electrical contact with the contact post.

Another embodiment of the invention includes a method of wafer level chip scale packaging wherein the semiconductor device further comprises a redistribution seed layer underlying the redistribution trace.

Another embodiment of the invention includes a method of wafer level chip scale packaging wherein the forming of an opening in the encapsulation layer down to the redistribution trace comprises laser drilling the opening in the encapsulation layer.

Another embodiment of the invention includes a method of wafer level chip scale packaging wherein the opening in the encapsulation layer is defined in part by side walls of the encapsulation layer and a portion of an upper surface of the redistribution layer, and further comprising forming a contact post seed layer in the opening in the encapsulation layer covering the side walls of the encapsulation layer and the portion of the top surface of the redistribution layer prior to forming a contact post in the opening in the encapsulation layer.

Another embodiment of the invention includes a method of wafer level chip scale packaging wherein forming of the contact post in the opening in the encapsulation layer comprises electroplating a metal over the semiconductor device and down into the opening in the encapsulation layer.

Another embodiment of the invention includes a method of wafer level chip scale packaging wherein the electroplated metal comprises copper.

Another embodiment of the invention includes a method of wafer level chip scale packaging wherein the forming of the contact post in the opening in the encapsulation layer comprises electroplating a metal over the contact post seed layer in the opening in the encapsulation layer.

Another embodiment of the invention includes a method of wafer level chip scale packaging wherein the electroplated metal electroplated over the seed layer comprises copper.

Another embodiment of the invention includes a method of wafer level chip scale packaging further comprising forming a barrier layer over the contact post.

Another embodiment of the invention includes a method of wafer level chip scale packaging wherein the barrier layer comprises nickel and gold.

Another embodiment of the invention includes a method of wafer level chip scale packaging wherein the electrically conductive bump is formed on the barrier layer over the contact post.

Another embodiment of the invention includes a method of wafer level chip scale packaging further comprising planarizing the semiconductor device to remove portions of the electroplated metal over the semiconductor device to expose the encapsulation layer leaving a contact post formed in the opening in the encapsulation layer.

Another embodiment of the invention includes a method of wafer level chip scale packaging further comprising planarizing the semiconductor device to remove portions of the electroplated metal and the contact post seed layer overlying the semiconductor device to expose the encapsulation layer and leaving a contact post in the opening in the encapsulation layer.

Another embodiment of the invention includes a method of wafer level chip scale packaging wherein the electrically conductive bump comprises solder.

Another embodiment of the invention includes a method of wafer level chip scale packaging including providing a semiconductor device having a silicon based substrate with discrete devices defined therein and a contact pad near an upper surface thereof, a passivation layer overlying the silicon based substrate and the contact pad, and the passivation layer having an opening therein exposing at least a portion of the contact pad, and a redistribution trace electrically connected to the contact pad near a first end and having a second end spaced a distance from the contact pad. Forming an encapsulation layer over the semiconductor device including the redistribution trace. Forming an opening in the encapsulation layer down to the redistribution trace. Forming a metal layer over the semiconductor device and down in the opening in the encapsulation layer. Planarizing the semiconductor device to remove a portion of the metal layer leaving a contact post in the opening in the encapsulation layer, and wherein the metal post has a first end in electrical contact with the redistribution trace, and the contact post having a second exposed end. Forming an electrically conductive bump on the semiconductor device and in electrical contact with the contact post.

Another embodiment of the invention includes a method of wafer level chip scale packaging including planarizing the semiconductor device wherein the semiconductor device further comprises a redistribution trace seed layer underlying the redistribution trace.

Another embodiment of the invention includes a method of wafer level chip scale packaging including planarizing the semiconductor device wherein the opening in the encapsulation layer is defined in part by side walls of the encapsulation layer and by a portion of the top surface of the redistribution layer, and further comprising forming a contact post seed layer in the opening in the encapsulation layer and over the side walls of the encapsulation layer and the contact post portion of the redistribution trace.

Another embodiment of the invention includes a method of wafer level chip scale packaging including planarizing the semiconductor device wherein the planarizing of the semiconductor device is conducted to remove portions of the metal layer and portions of the contact post seed layer to leave portions of the contact seed layer in the opening in the encapsulation layer.

Another embodiment of the invention includes a method of wafer level chip scale packaging including planarizing the semiconductor device wherein the forming of the opening in the encapsulation layer comprises laser drilling the opening in the encapsulation layer.

Another embodiment of the invention includes a method of wafer level chip scale packaging including providing a semiconductor device having a silicon based substrate with discrete devices defined therein and a contact pad near an upper surface thereof, a passivation layer overlying the silicon based substrate and the contact pad, and the passivation layer having an opening therein exposing at least a portion of the contact pad, and a redistribution trace electrically connected to the contact pad near a first end and having a second end spaced a distance from the contact pad. Forming encapsulation layer over the semiconductor device including the redistribution trace. Forming an opening in the encapsulation layer down to the redistribution trace. Forming a contact post seed layer over the semiconductor device. Forming a metal layer over the semiconductor device and down in the opening in the encapsulation layer. Chemical mechanical planarizing the semiconductor device to remove a portion of the metal layer and the contact post seed layer leaving portions of the contact post seed and a contact post in the opening in the encapsulation layer, and wherein the contact post has a first end in electrical contact with the redistribution trace, and the contact post having a second exposed end. Forming a barrier layer over the second exposed end of the contact post. Forming an electrically conductive bump over the barrier layer.

Another embodiment of the invention includes a method of wafer level chip scale packaging including chemical mechanical planarizing the semiconductor device wherein the forming of the metal layer comprises electroplating a metal over the semiconductor device.

Another embodiment of the invention includes a method of wafer level chip scale packaging including chemical mechanical planarizing the semiconductor device wherein the metal layer comprises copper.

Another embodiment of the invention includes a method of wafer level chip scale packaging including chemical mechanical planarizing the semiconductor device wherein the barrier layer comprises nickel and gold.

Another embodiment of the invention includes a method of wafer level chip scale packaging including chemical mechanical planarizing the semiconductor device wherein the encapsulation layer comprises an epoxy based material.

Another embodiment of the invention includes a method of wafer level chip scale packaging including chemical mechanical planarizing the semiconductor device wherein the encapsulation layer comprises an epoxy based material and a filler comprising silica.

Another embodiment of the invention includes a method of wafer level chip scale packaging including chemical mechanical planarizing the semiconductor device wherein the forming of the encapsulation layer comprises laminating an encapsulation material over the semiconductor device.

Another embodiment of the invention includes a method of wafer level chip scale packaging including chemical mechanical planarizing the semiconductor device wherein the forming of the encapsulation layer comprises depositing a liquid material over the semiconductor device and solidifying liquid material.

Another embodiment of the invention includes a method of making a semiconductor device comprising: providing a semiconductor device having a silicon based substrate with discrete devices defined therein and a contact metallurgy near an upper surface thereof; forming an encapsulation layer over the semiconductor device including the contact metallurgy; forming an opening in the encapsulation layer down to the contact metallurgy; forming a contact post in the opening in the encapsulation layer, and the contact post having a first end electrically connected to the contact metallurgy and a second exposed end; forming an electrically conductive bump on the semiconductor device and in electrical contact with the contact post.

Another embodiment of the invention includes a method of making a semiconductor device wherein the encapsulation material comprises an epoxy based material.

Another embodiment of the invention includes a method of making a semiconductor device wherein the forming of an opening in the encapsulation layer down to the contact metallurgy comprises laser drilling the opening in the encapsulation layer.

Another embodiment of the invention includes a method of making a semiconductor device wherein the forming of the contact post comprises electroplating a metal over the semiconductor device and down into the opening in the encapsulation layer and planarizing the semiconductor device to remove portions of the electroplated metal over the semiconductor device and to expose the encapsulation layer and leaving a contact post formed in the opening in the encapsulation layer.

These and other objects, features and advantages of the present invention will become apparent from the following brief description of the drawings, detailed description of the preferred embodiments, and appended claims and drawings.

DETAILED DESCRIPTION OF PREFERRED EMBODIMENTS

Figure 3A:
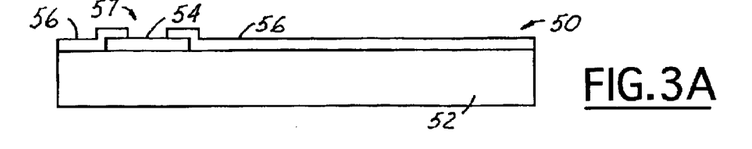
FIG. 3A illustrates a method of providing a semiconductor device having a silicon based substrate, a contact pad and passivation layer according to the present invention.

FIGS. 3A–J illustrate a method of making a wafer level chip scale package according to the present invention. A semiconductor device 50 (such as a wafer) is provided having a silicon based substrate 52 with discrete devices (not shown) formed therein and a contact pad 54 formed on upper surface thereof and associated with at least one of the discrete devices. A passivation layer 56 such as silicon dioxide is provided over the upper surface of the silicon based substrate 52 and includes an opening 57 therein exposing a portion of the contact pad 54 (FIG. 3A).

Figure 3B:
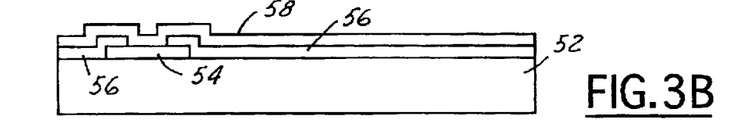
FIG. 3B illustrates forming a redistribution trace seed layer over the semiconductor device of FIG. 3A.
Figure 3C:
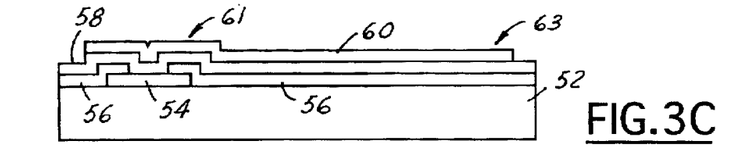
FIG. 3C illustrates the forming of a redistribution trace over the semiconductor device of FIG. 3B.

As illustrated in FIG. 3B, preferably a first seed layer 58 (redistribution seed layer) such as copper is provided over the upper surface of the semiconductor device 50 and contacts the exposed surface 57 of the contact pad 54. Preferably the first seed layer 58 is plated over the entire surface of the wafer. As illustrated in FIG. 3C, a redistribution trace 60 is selectively formed over the semiconductor device so that one end 61 is in electrical contact with the contact pad 54 and a second end 63 extends a distance horizontally away from the contact pad 54. The redistribution trace 60 may be made from any electrically conductive material but preferably is made from a copper based material that is either screen printed, selectively electroplated, or electroplated over the entire surface of the wafer and excess portions removed by etching, or is formed by any other method known to those skilled in the art. Likewise, excess portions of the seed layer 58 may be removed as desired.

Figure 3D:
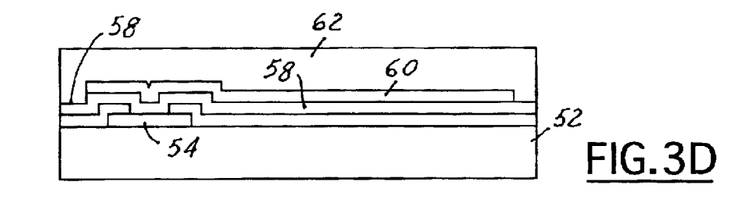
FIG. 3D illustrates the forming of an encapsulation layer over the semiconductor device of FIG. 3C.

As illustrated in FIG. 3D, thereafter an encapsulation layer 62 is formed over the entire surface of the semiconductor device including the redistribution trace 60. The encapsulation layer 62 may be formed on the semiconductor device 50 by any of a variety of methods including depositing a liquid encapsulation material and solidifying the liquid encapsulation material, depositing a self curing encapsulation material, depositing a liquid encapsulation material and baking the encapsulation material to provide a solid encapsulation, or applying a decal encapsulation material and adhering the decal onto the semiconductor device 50 with a separate adhesive layer, or heating the decal to adhere the same to the semiconductor device. The encapsulation layer may be an epoxy based material including, but not limited to, an amine-epoxy, or phenolic-epoxy.

Figure 3E:
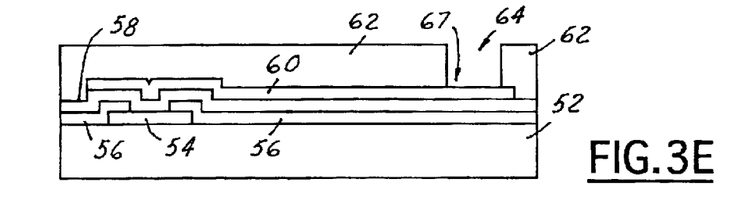
FIG. 3E illustrates the forming of an opening in the encapsulation layer of the semiconductor device of FIG. 3D.
Figure 3F:
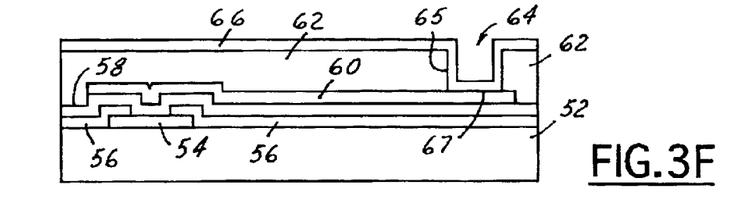
FIG. 3F illustrates the forming of a contact post seed layer over the semiconductor device of FIG. 3E.
Figure 3G:
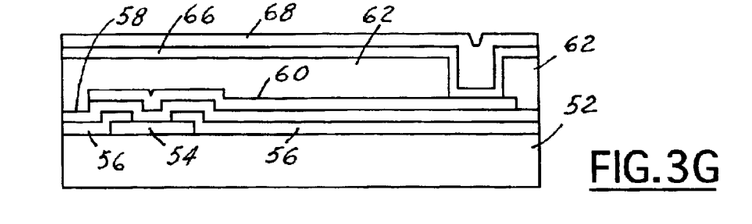
FIG. 3G illustrates the electroplating of copper over the semiconductor device and into the opening in the encapsulation layer according to the present invention.

Thereafter, an opening 64 is formed in the encapsulation layer 62 down to the redistribution trace 60 (FIG. 3E). Optionally, as illustrated in FIG. 3F, a second seed layer (contact post seed layer) 66 may be formed over the entire surface, and down into the opening 64 formed in the encapsulation layer 60 and along the encapsulation side walls 65 and a portion of the top surface 67 of the redistribution trace 60 that was exposed by laser drilling the opening 64. Preferably the second seed layer 66 is made from a suitable material to improve the adhesion of the material forming a contact post which will be described hereafter. A suitable material for the second seed layer includes copper. As shown in FIG. 3G, an electrically conductive layer 68 which preferably is a metal layer such as copper, is formed over the entire surface of the structure shown in FIG. 3F including the second seed layer 66.

Figure 3H:
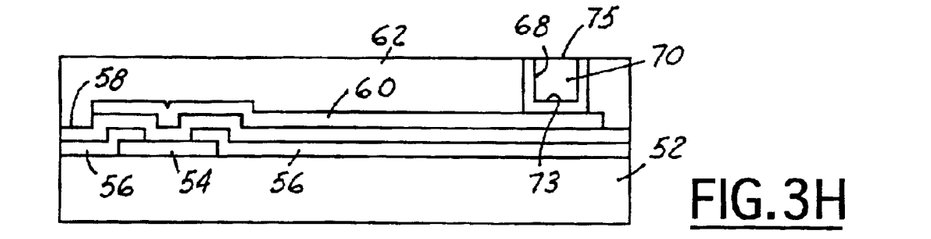
FIG. 3H illustrates the chemical mechanical planarizing of the semiconductor device to remove portions of the electroplated copper and copper post seed layer to leave a copper post in the opening in the encapsulation layer according to the present invention.

Thereafter, as illustrated in FIG. 3H, the electrically conductive layer 68 and the second seed layer 66 are planarized to expose the encapsulation layer 62 and to provide a contact post (copper post) 70 electrically connected to the redistribution trace 60 near the second end 63. Preferably the electrically conductive layer 68 and seed layer 66 are planarized using chemical mechanical planarization techniques for metals, in particular copper, in a manner known to those skilled in the art. The contact post 70 has a first end 73 in electrical contact with the redistribution trace 60 and a second exposed end 75.

In general, chemical mechanical planarization is a global surface planarizing technique. It planarizes the wafer surface by relative motion between a wafer and a polishing pad in the presence of a slurry and applied force. The chemical mechanical planarizing tool is often referred to as a polisher. In a polisher, the wafer is positioned in a wafer holder or carrier, and held against a polishing pad on a flat surface known as platen. The relative motion between the wafer and a polishing pad my differ in a variety of machines, but in general, most polishers use either rotary or orbital motion of the either the wafer holder or the platen. Although the exact mechanism for metal chemical mechanical planarization is not well understood, it is believed that the slurry comes in the contact with the metal surface and oxidizes it. For example, in the case of copper chemical mechanical planarization, copper oxide ($CuO$ or $Cu_2O$) and copper hydroxides ($Cu(OH)_2$) are formed. The metal oxide layer is then removed by mechanical abrasion from the particles in the slurry. Once the oxide layer is removed, the chemicals in the slurry oxidize the newly exposed metal surface and the process repeats itself. For copper metal slurries, alumina powder is typically used in an aqueous solution and may include a basic solution of $NH_4OH$.

Figure 3I:
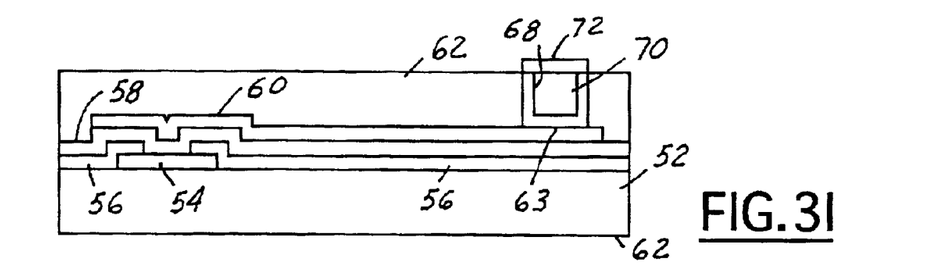
FIG. 3I illustrates forming a barrier layer over the copper contact post of the semiconductor device of FIG. 3H.
Figure 3J:
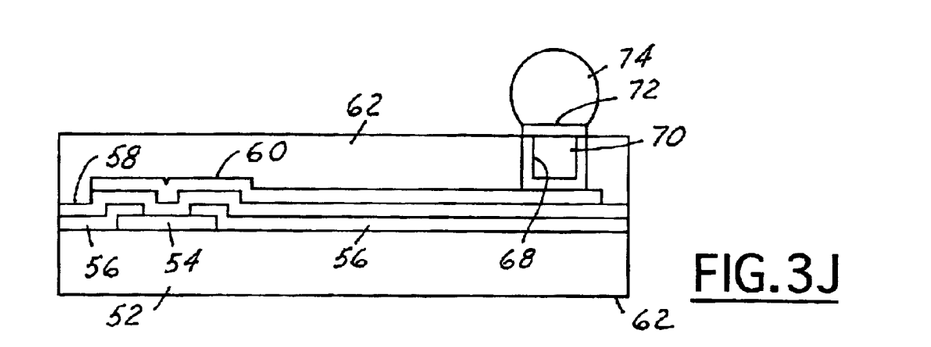
FIG. 3J illustrates the forming of a solder ball over the barrier layer and contact post of the semiconductor device of FIG. 3I.

As illustrated in FIG. 3I, thereafter, a post barrier layer 72 or an under bump metallurgy (as described in the background of the invention) is selectively formed on top of the second end 75 of the contact post 70. The barrier layer 72 preferably comprises nickel and gold and may be formed on the post 70 and a portion of the seed layer 68 by any of a variety of methods, but preferably is formed by electroless plating. As illustrated in FIG. 3J, an electrically conductive bump 74, which preferably is a solder ball, is formed on the post barrier layer 72 by any of a variety of methods such as those described in the background of the invention.

Figure 4:
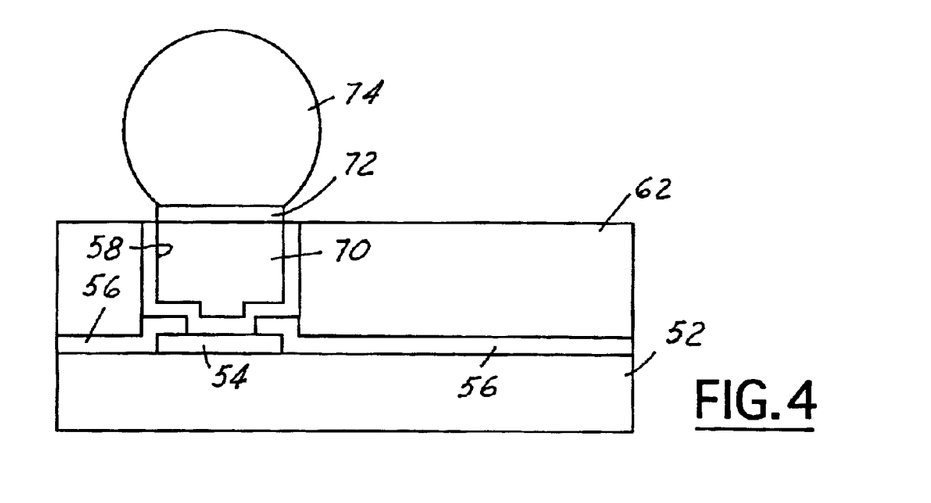
FIG. 4 illustrates another embodiment of a semiconductor device that may be made using a method according to the present invention.

FIG. 4 illustrates an alternative embodiment of a semiconductor device that may be made using a method according to the present invention. The alternative embodiment of the semiconductor device does not include a redistribution trace as is typical with a wafer level chip scale package. In the alternative embodiment, the semiconductor device may be a flip chip style semiconductor device having a silicon based substrate 52, and contact pad 54 near an upper surface thereof, and a passivation layer 56 overlying the semiconductor and having an opening therein exposing a portion of the contact pad 54 as described above. As described above, an encapsulation material 62 is deposited over the semiconductor device covering the passivation layer 56 and the contact pad 54. Thereafter, an opening, overlying the contact pad 54, is formed in the encapsulation layer, preferably by laser drilling (as described above with respect to FIG. 3). A seed layer 58 is deposited over the semiconductor device and down into the opening (as described above with respect to FIG. 3F). Alternatively, an under bump metallurgy as described in the background of the invention may be substituted for the seed layer 58. Thereafter, an electrically conductive material, such as copper, is formed over the semiconductor device preferably by electroplating (as described above with respect to FIG. 3G). The semiconductor device is then chemical mechanical planarized to remove portions of the electrically conductive layer and seed layer 58 leaving portions of the seed layer, and a contact post formed by the remaining portion of the electrically conductive layer in the opening formed in the encapsulation layer 62 (as described above with respect to FIG. 3H). Thereafter, a barrier layer 72 (or under bump metallurgy) is deposited over using the contact post 70 (as described above with respect to FIG. 3I). Finally, an electrically conductive bump 74 is deposited over the barrier layer 72 (as described above with respect to FIG. 3J) to form a flip chip style semiconductor device with the contact post. As will be used hereafter, the term "contact metallurgy" refers to the contact pad 54, seed layer 58 (or under bump metallurgy), redistribution trace 60, seed layer 68 (or under bump metallurgy) individually or in various combinations.

What is claimed is:

1. A method of wafer level chip scale packaging comprising:

providing a semiconductor device having a silicon based substrate with discrete devices defined therein and a contact pad near an upper surface thereof, a passivation layer overlying the silicon based substrate and the contact pad, and the passivation layer having an opening therein exposing at least a portion of the contact pad, and a redistribution trace electrically connected to the contact pad near a first end and having a second end spaced a distance from the contact pad;

forming an encapsulation layer over the semiconductor device including the redistribution trace;

forming an opening in the encapsulation layer down to the redistribution trace;

thereafter forming a contact post in the opening in the encapsulation layer comprising electroplating a metal over the semiconductor device and down into the opening in the encapsulation layer and planarizing the semiconductor device to remove portions of the electroplated metal over the semiconductor device to expose the encapsulation layer and leaving a contact post formed in the opening in the encapsulation layer, and the contact post having a first end electrically connected to the redistribution trace and a second exposed end;

forming an electrically conductive bump on the semiconductor device and in electrical contact with the contact post.

2. A method as set forth in claim 1 wherein the semiconductor device further comprises a redistribution seed layer underlying the redistribution trace.

3. A method as set forth in claim 1 wherein the forming of an opening in the encapsulation layer down to the redistribution trace comprises laser drilling the opening in the encapsulation layer.

4. A method as set forth in claim 1 wherein the opening in the encapsulation layer is defined in part by side walls of the encapsulation layer and a portion of an upper surface of the redistribution layer, and further comprising forming a contact post seed layer in the opening in the encapsulation layer covering the side walls of the encapsulation layer and the portion of the top surface of the redistribution layer prior to forming the contact post in the opening in the encapsulation layer, and wherein the contact post seed layer overlies at least a portion of an upper surface of the encapsulation layer.

5. A method as set forth in claim 4 wherein the forming of the contact post in the opening in the encapsulation layer comprises electroplating a metal over the contact post seed layer in the opening in the encapsulation layer.

6. A method as set forth in claim 5 wherein the electroplated metal comprises copper.

7. A method as set forth in claim 4 wherein the forming of the contact post comprises planarizing the semiconductor device to remove portions of the electroplated metal and a contact post seed layer overlying the upper surface of the encapsulation layer_to expose the encapsulation layer and leaving the contact post in the opening in the encapsulation layer.

8. A method as set forth in claim 1 wherein the electroplated metal comprises copper.

9. A method as set forth in claim 1 further comprising forming a barrier layer over the contact post.

10. A method as set forth in claim 9 wherein the barrier layer comprises nickel and gold.

11. A method as set forth in claim 9 wherein the electrically conductive bump is formed on the barrier layer over the contact post.

12. A method as set forth in claim 1 wherein the electrically conductive bump comprises solder.

13. A method as set forth in claim 1 wherein the forming of the metal layer comprises electroplating a metal over the semiconductor device.

14. A method as set forth in claim 13 wherein the metal layer comprises copper.

15. A method as set forth in claim 13 wherein the barrier layer comprises nickel and gold.

16. A method of wafer level chip scale packaging comprising:
providing a semiconductor device having a silicon based substrate with discrete devices defined therein and a contact pad near an upper surface thereof, a passivation layer overlying the silicon based substrate and the contact pad, and the passivation layer having an opening therein exposing at least a portion of the contact pad, and a redistribution trace electrically connected to the contact pad near a first end and having a second end spaced a distance from the contact pad;
forming an encapsulation layer over the semiconductor device including the redistribution trace;
forming an opening in the encapsulation layer down to the redistribution trace;
thereafter forming a metal layer over the semiconductor device and down in the opening in the encapsulation layer;
planarizing the semiconductor device to remove a portion of the metal layer leaving a contact post in the opening in the encapsulation layer, and wherein the contact post has a first end in electrical contact with the redistribution trace, and the contact post having a second exposed end;
forming an electrically conductive bump on the semiconductor device and in electrical contact with the contact post.

17. A method as set forth in claim 16 wherein the semiconductor device further comprises a redistribution trace seed layer underlying the redistribution trace.

18. A method as set forth in claim 16 wherein the opening in the encapsulation layer is defined in part by side walls of the encapsulation layer and by a portion of the top surface of the redistribution layer, and further comprising forming a contact post seed layer over an upper surface of the encapsulation layer and in the opening in the encapsulation layer and over the side walls of the encapsulation layer and the portion of the redistribution trace.

19. A method as set forth in claim 18 wherein the planarization of the semiconductor device is conducted to remove portions of the contact post seed layer over the upper surface of the encapsulation layer to leave portions of the contact seed layer in the opening in the encapsulation layer.

20. A method as set forth in claim 16 wherein the forming of the opening in the encapsulation layer comprises laser drilling the opening in the encapsulation layer.

21. A method of wafer level chip scale packaging comprising:
providing a semiconductor device having a silicon based substrate with discrete devices defined therein and a contact pad near an upper surface thereof, a passivation layer overlying the silicon based substrate and the contact pad, and the passivation layer having an opening therein exposing at least a portion of the contact pad, and a redistribution trace electrically connected to the contact pad near a first end and having a second end spaced a distance from the contact pad;
forming an encapsulation layer over the semiconductor device including the redistribution trace;
forming an opening in the encapsulation layer down to the redistribution trace;
forming a contact post seed layer over the semiconductor device including the encapsulation layer;
thereafter forming a metal layer over the semiconductor device, including the contact post seed layer, and down into the opening in the encapsulation layer;
chemical mechanical planarizing the semiconductor device to remove a portion of the metal layer and the contact post seed layer and exposing the encapsulation layer leaving portions of the contact post seed and a contact post in the opening in the encapsulation layer, and wherein the contact post has a first end in electrical contact with the redistribution trace, and the contact post having a second exposed end;
forming a barrier layer over the second exposed end of the contact post;
forming an electrically conductive bump over the barrier layer.

22. A method as set forth in claim 21 wherein the encapsulation layer comprises an epoxy based material.

23. A method as set forth in claim 21 wherein the encapsulation layer comprises an epoxy based material and a filler comprising silica.

24. A method as set forth in claim 21 wherein the forming of the encapsulation layer comprises laminating an encapsulation material over the semiconductor device.

25. A method as set forth in claim 21 wherein the forming of the encapsulation layer comprises depositing a liquid encapsulation material over the semiconductor device and solidifying liquid encapsulation material.

26. A method of making a semiconductor device comprising:

providing a semiconductor device having a silicon based substrate with discrete devices defined therein and a contact metallurgy near an upper surface thereof;

forming an encapsulation layer over the semiconductor device including the contact metallurgy;

forming an opening in the encapsulation layer down to the contact metallurgy;

thereafter forming a contact post in the opening in the encapsulation layer comprising electroplating a metal over the semiconductor device and down into the opening in the encapsulation layer and planarizing the semiconductor device to remove portions of the electroplated metal over the semiconductor device and to expose the encapsulation layer and leaving a contact post formed in the opening in the encapsulation layer, and the contact post having a first end electrically connected to the redistribution trace and a second exposed end;

forming an electrically conductive bump on the semiconductor device and in electrical contact with the contact post.

27. A method as set forth in claim 26 wherein the encapsulation material comprises an epoxy based material.

28. A method as set forth in claim 26 wherein the forming of an opening in the encapsulation layer down to the contact metallurgy comprises laser drilling the opening in the encapsulation layer.

* * * * *